United States Patent
Glazunov et al.

(10) Patent No.: US 9,130,152 B2
(45) Date of Patent: Sep. 8, 2015

(54) PIEZOELECTRIC COMPONENT

(75) Inventors: Alexander Glazunov, Deutschlandsberg (AT); Martin Galler, Graz (AT)

(73) Assignee: EPCOS AG, Munich (DE)

( * ) Notice: Subject to any disclaimer, the term of this patent is extended or adjusted under 35 U.S.C. 154(b) by 350 days.

(21) Appl. No.: 13/575,997

(22) PCT Filed: Feb. 1, 2011

(86) PCT No.: PCT/EP2011/051397
§ 371 (c)(1),
(2), (4) Date: Oct. 20, 2012

(87) PCT Pub. No.: WO2011/095481
PCT Pub. Date: Aug. 11, 2011

(65) Prior Publication Data
US 2013/0033155 A1    Feb. 7, 2013

(30) Foreign Application Priority Data
Feb. 2, 2010    (DE) .......................... 10 2010 006 587

(51) Int. Cl.
*H01L 41/08*    (2006.01)
*H01L 41/083*   (2006.01)

(52) U.S. Cl.
CPC .................................. *H01L 41/0838* (2013.01)

(58) Field of Classification Search
CPC .... H01L 41/24; H01L 41/08; H01L 41/41083
USPC .................................. 310/328, 363–367, 311
See application file for complete search history.

(56) References Cited

U.S. PATENT DOCUMENTS

| | | | |
|---|---|---|---|
| 7,358,655 B2 | 4/2008 | Ragossnig et al. | |
| 7,449,077 B2 * | 11/2008 | Heinzmann et al. | 156/89.12 |
| 7,982,373 B2 * | 7/2011 | Doellgast et al. | 310/366 |
| 8,022,598 B2 * | 9/2011 | Kuegerl et al. | 310/328 |
| 8,276,567 B2 * | 10/2012 | Nakamura | 310/364 |
| 8,304,963 B2 * | 11/2012 | Gabl et al. | 310/328 |
| 8,314,535 B2 * | 11/2012 | Dernovsek et al. | 310/364 |
| 2006/0238073 A1 | 10/2006 | Ragossnig et al. | |
| 2010/0078505 A1 | 4/2010 | Kato | |
| 2010/0102138 A1 | 4/2010 | Denzler et al. | |
| 2010/0325854 A1 | 12/2010 | Reichinger | |

FOREIGN PATENT DOCUMENTS

| | | |
|---|---|---|
| CN | 1659719 A | 8/2005 |
| DE | 102 34 787 C1 | 10/2003 |
| DE | 103 07 825 A1 | 9/2004 |
| DE | 10 2007 015 446 A1 | 10/2008 |
| DE | 10 2007 037 500 A1 | 11/2008 |
| DE | 10 2008 011 414 A1 | 9/2009 |
| EP | 1 764 844 A1 | 3/2007 |
| EP | 1942533 A1 | 7/2008 |

(Continued)

*Primary Examiner* — Thomas Dougherty
*Assistant Examiner* — Karen B Addison
(74) *Attorney, Agent, or Firm* — Slater & Matsil, L.L.P.

(57) ABSTRACT

A piezoelectric component includes at least one planned fracture layer for generating and guiding cracks in the component in a controlled manner. The planned fracture layer is disposed between two electrode layers adjacent to each other in the direction of the stack. The distance $d_2$ of the two electrode layers is greater than the distance dl of two adjacent electrode layers between which no planned fracture layer is provided.

11 Claims, 3 Drawing Sheets

(56) References Cited

FOREIGN PATENT DOCUMENTS

| | | |
|---|---|---|
| EP | 2124268 A1 | 11/2009 |
| JP | 03-138987 A | 6/1991 |
| JP | 4337682 A | 11/1992 |
| JP | 2009200359 A | 9/2009 |
| WO | WO 03/105246 A2 | 12/2003 |
| WO | 2008066098 A1 | 6/2008 |
| WO | WO 2009/092584 A1 | 7/2009 |
| WO | WO 2010/012830 A1 | 2/2010 |

* cited by examiner

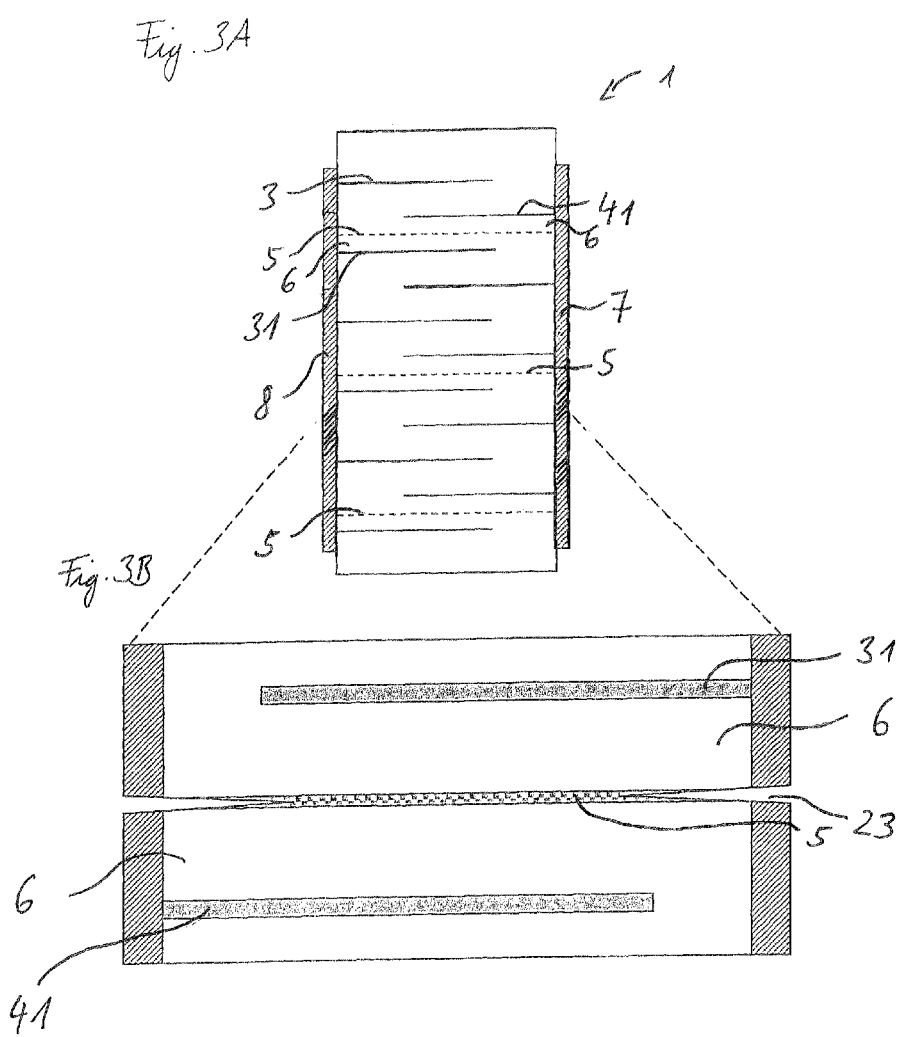

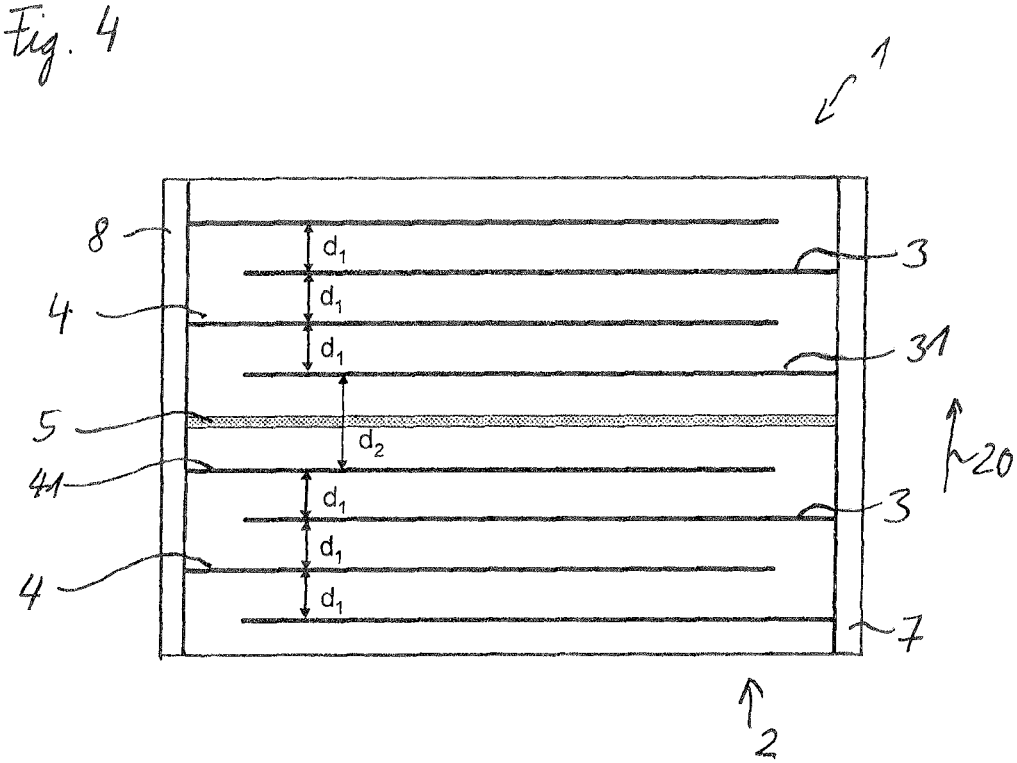

PIEZOELECTRIC COMPONENT

This patent application is a national phase filing under section 371 of PCT/EP2011/051397, filed Feb. 1, 2011, which claims the priority of German patent application 10 2010 006 587.0, filed Feb. 2, 2010, each of which is incorporated herein by reference in its entirety.

TECHNICAL FIELD

A piezoelectric component comprising a predetermined breaking layer is specified. The predetermined breaking layer serves for the controlled production and guidance of cracks in the component. By way of example, the component is a piezo-actuator that can be used for actuating an injection valve in a motor vehicle.

BACKGROUND

The German patent document DE 103 07 825 A discloses a piezo-actuator wherein ceramic predetermined breaking layers are arranged in the stack.

The PCT patent document WO 2009/092584 discloses a piezo-actuator wherein a predetermined breaking layer is produced by means of a metallic sacrificial layer.

SUMMARY OF THE INVENTION

In one aspect of the invention, a piezoelectric component has a high reliability.

A piezoelectric component is specified which comprises a stack of piezoelectric layers and electrode layers arranged therebetween. The stack comprises at least one predetermined breaking layer for the controlled production and guidance of cracks in the component.

By way of example, the piezoelectric component is embodied as a piezo-actuator. When a voltage is applied to the electrode layers, the piezoelectric layers expand in the stacking direction, with the result that a stroke of the actuator is generated.

The piezoelectric layers can comprise a ceramic material, for example lead zirconate titanate. In order to produce the component, it is possible to use piezoelectric green sheets, to which a metal paste is applied in order to form electrode layers in a screen printing method. By way of example, a copper paste, a silver paste or a paste composed of a mixture or alloy of silver and palladium can be used here. The sheets are stacked, pressed and jointly sintered, thus giving rise to a monolithic sintering body.

By way of example, the electrode layers extend, as seen in the stacking direction, alternately as far as to one of the outer sides of the stack and are spaced apart from the opposite outer side of the stack. In order to make electrical contact with the electrode layers, on the opposite outer sides it is possible to apply external electrodes, e.g., in the form of base metallizations, to which the electrode layers extending to the respective outer side are electrically connected. A voltage can be applied between adjacent electrode layers via the external electrodes.

During the operation of the piezoelectric component, mechanical stresses and, as a consequence thereof, cracks can occur in the component. During production, too, e.g., during the polarization of the piezoelectric material or during other thermal processes, cracks can arise in the component. If a crack that has arisen runs in the stack in such a way that electrode layers of different polarities are bridged, short circuits can arise, which can lead to the failure of the component.

By arranging one or a plurality of predetermined breaking layers in the stack, the intention is to reduce the risk of failures of the component on account of such cracks. For this purpose, by means of the predetermined breaking layers, cracks are produced in a controlled manner in the component and guided such that no bridging of electrode layers of different polarities occurs. The cracks produced in a controlled manner make it possible to reduce mechanical stresses in the component in a targeted manner.

Preferably, the predetermined breaking layers are embodied such that a crack arises at a location predefined by the predetermined breaking layer in the component and runs only in a plane parallel to the planes of the electrode layers. Particularly preferably, the predetermined breaking layers have, in comparison with the material adjoining the predetermined breaking layer, a reduced mechanical strength, such that a crack with high probability arises in the predetermined breaking layer and propagates only within the predetermined breaking layer.

In one preferred embodiment, the predetermined breaking layer comprises a piezoelectric material.

By way of example, the predetermined breaking layer comprises the same material as the piezoelectric layers of the stack. In this case, particularly cost-effective production of the component is possible since the predetermined breaking layer does not require any materials other than those required for the other piezoelectric layers of the component.

Preferably, the predetermined breaking layer has a higher porosity than other piezoelectric layers.

The porosity of a layer results from the proportion by volume of the pores in a volume of the layer. A predetermined breaking layer having higher porosity can be produced, for example, from a green sheet having an increased proportion of binder. Prior to sintering, the binder is removed by a decarburization process, such that in the place of the binder pores remain in the layer. Given an increased proportion of binder, it is possible to increase the porosity, e.g., the size and the number of the pores in the layer.

The predetermined breaking layer is arranged between two electrode layers adjacent to one another in the stacking direction, said electrode layers having a different polarity when a voltage is applied. The distance $d_2$ between these two electrode layers is greater than the distance $d_1$ between two mutually adjacent electrode layers between which no predetermined breaking layer is arranged.

By virtue of the fact that the mutually adjacent electrode layers between which the predetermined breaking layer is arranged have a different polarity, that region of the stack which is situated between these two electrode layers can be utilized for the function of the component. In the case where the component is a piezo-actuator, the region can contribute to the stroke of the actuator.

As a result of the greater distance $d_2$ between these two electrode layers, the electric field between these electrode layers is lower than between electrode layers having the distance $d_1$. The electric field E between two electrode layers arranged at the distance d and having different polarities is calculated, given an applied voltage U, as $E=U/d$. As a result of the reduced electric field is it possible to reduce the risk of damage to the component as a result of foreign substances penetrating into the stack, such as, e.g., water, fuels, lubricants or constituents of the encapsulation material. By way of example, these substances can penetrate into the pores of a porous predetermined breaking layer or into a crack that has arisen in a predetermined breaking layer and lead to damage of the component. A strong electric field can foster the penetration of polar foreign substances into the predetermined breaking layer or into cracks that have arisen. Foreign substances that have penetrated into the component can lead, under the influence of high electric field strengths, to changes and damage to the component, e.g., to damage to the material in the piezoelectric layers.

Given a reduced field strength it is possible to dispense with further complex measures that are intended to prevent the ingress of foreign substances. By way of example, the component is embodied in a manner free of complex encapsulation. The predetermined breaking layer is embodied homogeneously, for example, and free of an additional structuring that is intended to prevent the ingress of foreign substances.

Through a suitable choice of the distance between two mutually adjacent electrode layers between which the predetermined breaking layer is arranged, firstly the risk of failure of the component can be kept small and secondly it is possible to ensure that these regions of the stack also contribute to the function of the component. By way of example, the stroke of a piezo-actuator comprising one or a plurality of predetermined breaking layers arranged between two electrode layers of different polarities is greater than in the case of a piezo-actuator of identical length comprising predetermined breaking layers arranged between two electrode layers having the same polarity. In the second case, the region between these two electrode layers is field-free and does not contribute to the stroke of the actuator.

In one embodiment, the relationship $d_2 > 2\, d_1$ holds true for the distances $d_1$ and $d_2$.

In this embodiment, the electric field is significantly reduced in that region of the stack in which the predetermined breaking layer is arranged, as a result of which the risk of damage to the component as a result of the ingress of foreign substances is kept as low as possible. Consequently, this embodiment has a particularly high reliability. Particularly preferably, the relationship $d_2 \geq 2.5\, d_1$ holds true for the distances $d_1$ and $d_2$.

In an alternative embodiment of the component, the relation $d_2 < 2\, d_1$ holds true for the distances $d_1$ and $d_2$.

In this embodiment, the electric field, in that region in which the predetermined breaking layer is arranged, is reduced somewhat in comparison with other regions. The risk of the ingress of foreign substances is reduced as a result. At the same time, that region of the component in which the predetermined breaking layer is arranged has only a low loss of power in comparison with other regions. By way of example, the stroke of a piezo-actuator which comprises one or a plurality of predetermined breaking layers and wherein the distances between the electrode layers fulfill the relationship $d_2 < 2\, d_1$ is only slightly less than in the case of a piezo-actuator wherein all electrode layers are arranged at the distance $d_1$ from one another.

In one embodiment, the predetermined breaking layer adjoins at least one piezoelectric layer. Preferably, the predetermined breaking layer is arranged between two piezoelectric layers and adjoins the latter.

Particularly preferably, at least one of the piezoelectric layers adjoining the predetermined breaking layer is arranged between the same mutually adjacent electrode layers as the predetermined breaking layer. In particular, in this case, no electrode layer is arranged between the predetermined breaking layer and the piezoelectric layer.

In the case of such an arrangement of the predetermined breaking layer, the risk that cracks will bridge electrode layers of different polarities or penetrating substances will advance as far as the electrode layers is particularly low since the cracks or the penetrating substances for this purpose would first have to cross the adjoining piezoelectric layer. By way of example, the thickness of the layer adjoining the predetermined breaking layer is greater than the thickness of a piezoelectric layer which does not adjoin a predetermined breaking layer.

Preferably, the predetermined breaking layer is arranged between two piezoelectric layers directly adjoining it, which are situated between the same mutually adjacent electrode layers as the predetermined breaking layer.

In this case, by way of example, the thicknesses of the layers adjoining the predetermined breaking layer are greater than the thicknesses of piezoelectric layers which do not adjoin a predetermined breaking layer. In particular, in this case the predetermined breaking layer does not adjoin an electrode layer. As a result, the risk of the bridging of the electrode layers by cracks or penetrating substances is particularly low.

In the case where the predetermined breaking layer adjoins a piezoelectric layer, the predetermined breaking layer preferably has a lower mechanical strength than the piezoelectric layer.

As a result, a crack arises in the predetermined breaking layer with greater probability than in the adjoining piezoelectric layer and also propagates with high probability only in the predetermined breaking layer. In particular, it is possible to prevent the crack from deviating into the adjoining piezoelectric layer.

Preferably, the predetermined breaking layer has a smaller thickness than an adjoining piezoelectric layer. Particularly preferably, the thickness of the predetermined breaking layer is significantly less than the thickness of an adjoining piezoelectric layer.

As a result, in the case where the predetermined breaking layer, e.g., on account of low piezoelectricity, makes little or no contribution to the power of the component, e.g., to the stroke of an actuator, this loss of power can be kept small. Moreover, cracks or foreign substances penetrating into the predetermined breaking layer can be limited to a narrowly delimited region, such that the component is disturbed as little as possible. In the case where the predetermined breaking layer is produced from a green sheet, the thickness of said green sheet can be significantly less than the thickness of the green sheets for the other piezoelectric layers. As an alternative thereto, a predetermined breaking layer can be formed from a single green sheet and another piezoelectric layer can be formed from a plurality of unprinted green sheets stacked one above another.

The predetermined breaking layer can also comprise a conductive material.

In particular, the predetermined breaking layer can comprise a metal, for example copper, silver or palladium, or a mixture or alloy of said metals. The predetermined breaking layer can also be formed from the same materials as the electrode layers.

In one embodiment, the predetermined breaking layer is embodied as a metal layer. In this case, the predetermined breaking layer consists of metals or comprises one or a plurality of metals as main constituent. By way of example, the predetermined breaking layer contains a material composition similar or identical to that of an electrode layer.

Preferably, the predetermined breaking layer extends over the entire cross-sectional area perpendicularly to the stacking direction.

In this case, the production and guidance of cracks can be controlled in the entire cross-sectional area. In particular, it is possible to prevent cracks that run in the predetermined breaking layer from deviating along the stacking direction.

This is also intended to include the case where the predetermined breaking layer has cutouts, as long as the arrangement and size of the cutouts are chosen such that guidance of cracks parallel to the plane of the electrode layers is achieved in the entire cross-sectional area.

BRIEF DESCRIPTION OF THE DRAWINGS

The component specified is explained below with reference to schematic figures, which are not true to scale.

FIG. 3A shows a piezoelectric component with predetermined breaking layers in longitudinal section, FIG. 3B shows a detail of the component from FIG. 3A with a crack running within the predetermined breaking layer, FIG. 4 shows a detail of a longitudinal section of a piezoelectric component with a predetermined breaking layer, wherein the relationship $d_2 > 2d_1$ holds true for the distances between the electrode layers.

DETAILED DESCRIPTION OF ILLUSTRATIVE EMBODIMENTS

Figure 1:
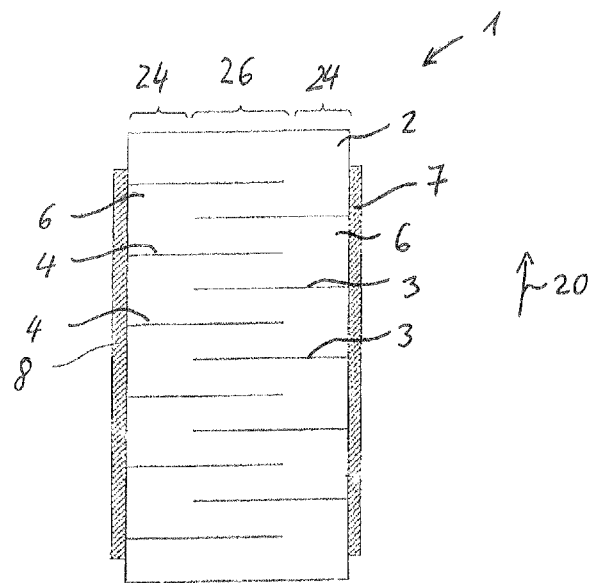
FIG. 1 shows a piezoelectric component in longitudinal section.

The FIG. 1 shows a piezoelectric component 1, which is embodied as a piezo-actuator. The component 1 is a multi-layer component comprising a stack 2 of piezoelectric layers 6 and electrode layers 3, 4 arranged therebetween. The piezoelectric layers 6 expand in the stacking direction 20 when a voltage is applied to the electrode layers 3, 4.

The electrode layers 3, 4 are led, as seen in the stacking direction 20, alternately as far as to one of the outer side of the stack 2 and are spaced apart from the opposite outer side. Planar external electrodes 7, 8 are arranged on the outer sides of the stack, and are electrically connected to the electrode layers 3, 4 led as far as to the respective outer side. In this way, via the external electrodes 7, 8, an electrical voltage can be applied between adjacent electrode layers 3, 4. In this case, first electrode layers 3 electrically connected to one of the external electrodes 7 have a first polarity and second electrode layers 4 connected to the other external electrode 8 have a second polarity, opposite to said first polarity.

By way of example, the piezoelectric layers 6 comprise a ceramic material such as lead zirconate titanate (PZT). In order to produce the component 1, it is possible to use ceramic green sheets that are printed with a metal-containing paste in order to form the electrode layers 3, 4. By way of example, a copper paste, a silver paste, or a paste composed of an alloy or mixture of silver and palladium is used.

The geometry of the electrode layers 3, 4 gives rise to inactive zones 24, in which electrode layers 3, 4 that are adjacent as seen in the stacking direction 20 do not overlap. In these regions of the stack 2, when an electrical voltage is applied to the electrode layers 3, 4, the electric field strength is significantly lower than in an active zone 26, in which an overlap of the electrode layers 3, 4 is present. This can lead to mechanical stresses and, in particular, to cracks in the stack 2.

Figure 2A:
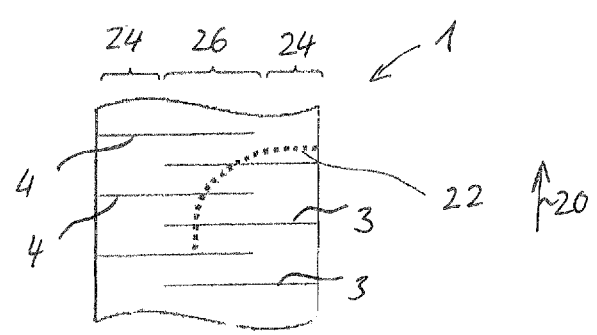
FIG. 2A shows a detail of a piezoelectric component with a crack running in the stacking direction.

FIG. 2A shows a detail of the piezoelectric component 1, wherein a crack 22 has formed in the stack 2 on account of mechanical stresses between the active zone 26 and the inactive zones 24. The crack 22 has arisen at one of the outer sides of the stack 2 and runs within the inactive zone 24 parallel to the electrode layers 3, 4. During the propagation of the crack 22 into the active zone 26, the crack has deviated along the stacking direction 20, such that adjacent electrode layers 3, 4 of different polarities are bridged by the crack 22. This can lead, for example upon the ingress of conductive substances into the crack 22, to short circuits and to a failure of the component 1.

Figure 2B:
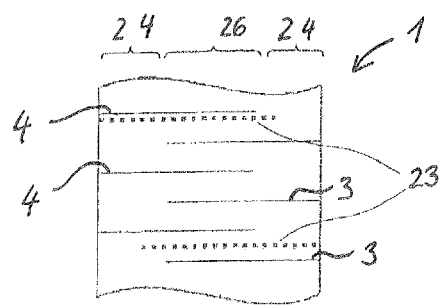
FIG. 2B shows a detail of a piezoelectric component with a crack running parallel to the planes of the electrode layers.

FIG. 2B shows a detail of a piezoelectric component 1, wherein cracks 23 have formed which run parallel to the planes of the electrode layers 3, 4 both in the inactive zone 24 and in the active zone 26. In contrast to the cracks 22 shown in FIG. 2A, these cracks 23 do not cause any short circuits since no bridging of electrode layers 3, 4 occurs here. By virtue of the cracks 23 running parallel, it is possible to reduce mechanical stresses in the component 1 in a controlled manner. For this reason, cracks 23 running parallel are desired in the stack 2.

By inserting predetermined breaking layers in the stack 2, the intention is to control the production and the propagation of cracks 23 in such a way that cracks 23 run only within the predetermined breaking layer or in a region directly adjoining the latter, and thus also substantially parallel to the planes of the electrode layers 3, 4.

FIG. 3A shows a piezoelectric component 1 in the form of a piezo-actuator, which is constructed like the component 1 from FIG. 1, but additionally comprises predetermined breaking layers 5, in which cracks 23 are produced in a controlled manner and guided parallel to the planes of the electrode layers 3, 4.

The predetermined breaking layers 5 are respectively arranged between two mutually adjacent electrode layers 31, 41 of different polarities and adjoin two piezoelectric layers 6. The predetermined breaking layer 5 is formed from the same material as the adjoining piezoelectric layers 6 but has a higher porosity than the piezoelectric layers 6. As a result, the predetermined breaking layer 5 has a lower mechanical strength than the adjoining piezoelectric layers 6. For this reason, in the case of mechanical stresses in the stack 2, a crack with high probability is produced in the predetermined breaking layer 5 and propagates within the predetermined breaking layer 5.

FIG. 3B shows a detail of the stack 2 of FIG. 3A, wherein a crack 23 has formed in the predetermined breaking layer 5. The crack runs in the predetermined breaking layer 5 and thus parallel to the planes of the electrode layers 3, 4.

FIG. 4 shows a detail of a piezoelectric component 1, which is constructed like the component 1 of FIG. 3A, but here the distances $d_2$, $d_1$ between the mutually adjacent electrode layers 3, 4, 31, 41 are chosen in such a way that firstly the risk of failures as a result of penetrating substances is kept small and at the same time the performance of the component 1 is not impaired very much during operation.

The predetermined breaking layer 5 is arranged between two electrode layers 31, 41 of different polarities, said electrode layers being adjacent to one another in the stacking direction 20. The distance $d_2$ between these two electrode layers 31, 41 is greater than the distance $d_1$ between two mutually adjacent electrode layers 3, 4 between which no predetermined breaking layer 5 is arranged.

As a result of the increased distance $d_2$, the electric field generated between the electrode layers 31, 41 between which the predetermined breaking layer 5 is situated is reduced. This has the effect that foreign substances will penetrate with lower probability into the predetermined breaking layers 5 or into cracks 23 that have arisen. Moreover, it is possible to prevent foreign substances that have penetrated into the predetermined breaking layer 5 or into a crack 23 from reaching the electrode layers 31, 41. The reliability of the component 1 can be increased in this way. By way of example, the distance $d_2$ is greater than $2d_1$.

The predetermined breaking layer 5 extends over the entire cross-sectional area of the stack. In this case, small cutouts can be provided in the predetermined breaking layer 5, said cutouts being filled, for example, with piezoelectric material of the adjoining piezoelectric layers 6. However, the predetermined breaking layer 5 must extend over the entire cross-sectional area in such a way that a crack course parallel to the planes of the electrode layers 3, 4 is predefined in the entire cross-sectional area.

One or a plurality of predetermined breaking layers 5 can be provided in the component 1. Preferably, predetermined breaking layers 5 are arranged in a manner distributed over the stack 2 at uniform distances.

The invention claimed is:

1. A piezoelectric component, comprising:
    a stack of piezoelectric layers and electrode layers arranged therebetween, wherein the stack comprises at least one predetermined breaking layer for the controlled production and guiding of cracks in the component, wherein the predetermined breaking layer is arranged between two electrode layers adjacent to one another in the stacking direction, the electrode layers having a different polarity when a voltage is applied, wherein a distance $d2$ between these two electrode layers is greater than a distance $d1$ between two mutually adjacent electrode layers between which no predetermined breaking layer is arranged, and wherein the following holds true for the distances $d1$ and $d2$: $d2<2d1$.

2. The piezoelectric component according to claim 1, wherein the predetermined breaking layer comprises a piezoelectric material.

3. The piezoelectric component according to claim 1, wherein the predetermined breaking layer comprises a conductive material.

4. The piezoelectric component according to claim 3, wherein the predetermined breaking layer is embodied as a metal layer.

5. The piezoelectric component according to claim 1, wherein the predetermined breaking layer adjoins at least one piezoelectric layer.

6. The piezoelectric component according to claim 5, wherein the predetermined breaking layer is arranged between and adjoins two piezoelectric layers.

7. The piezoelectric component according to claim 5, wherein at least one of the piezoelectric layers adjoining the predetermined breaking layer is arranged between the same mutually adjacent electrode layers as the predetermined breaking layer.

8. The piezoelectric component according to claim 5, wherein the predetermined breaking layer has a lower mechanical strength than an adjoining piezoelectric layer.

9. The piezoelectric component according to claim 5, wherein the predetermined breaking layer has a higher porosity than an adjoining piezoelectric layer.

10. The piezoelectric component according to claim 5, wherein the predetermined breaking layer has a smaller thickness than an adjoining piezoelectric layer.

11. The piezoelectric component according to claim 1, wherein the predetermined breaking layer extends over the entire cross-sectional area perpendicularly to the stacking direction of the stack.

* * * * *